US008946095B2

(12) United States Patent
Chen et al.

(10) Patent No.: US 8,946,095 B2
(45) Date of Patent: Feb. 3, 2015

(54) METHOD OF FORMING INTERLAYER DIELECTRIC FILM ABOVE METAL GATE OF SEMICONDUCTOR DEVICE

(71) Applicant: Taiwan Semiconductor Manufacturing Co., Ltd., Hsin-Chu (TW)

(72) Inventors: Li Chen, New Taipei (TW); Jyh-Nan Lin, Hsinchu (TW); Chin-Feng Sun, Zhubei (TW); Po-Hsiung Leu, Lujhu Township (TW); Ding-I Liu, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 175 days.

(21) Appl. No.: 13/660,363

(22) Filed: Oct. 25, 2012

(65) Prior Publication Data
US 2014/0120706 A1     May 1, 2014

(51) Int. Cl.
*H01L 21/469*     (2006.01)
*H01L 21/283*     (2006.01)

(52) U.S. Cl.
CPC ................................ *H01L 21/283* (2013.01)
USPC ........................................ 438/783; 438/778

(58) Field of Classification Search
USPC .......................... 438/758, 778, 783
See application file for complete search history.

(56) References Cited

U.S. PATENT DOCUMENTS

| 5,370,923 | A | * | 12/1994 | Goad et al. | ................. | 428/209 |
| 5,503,882 | A | * | 4/1996 | Dawson | ................. | 438/763 |
| 6,221,746 | B1 | | 4/2001 | Huang et al. | | |
| 6,645,818 | B1 | | 11/2003 | Sing et al. | | |
| 6,872,627 | B2 | | 3/2005 | Chen et al. | | |
| 2004/0023500 | A1 | * | 2/2004 | Dokumaci et al. | ............ | 438/694 |
| 2005/0127810 | A1 | * | 6/2005 | Fukuhara et al. | ............ | 313/364 |
| 2010/0240204 | A1 | | 9/2010 | Yeh et al. | | |

OTHER PUBLICATIONS

"Silicon Compounds (Esters)", Table 1. Physical Properties of Silane Esters, vol. 22, p. 72.
"Silicon Semiconductors", Doping, Copyright 1996-2012 Air Products and Chemicals, Inc., retrieved from http://www.airproducts.com/industries/Semiconductors/Silicon-Semiconductors/product-lit . . . , 2 pages.
Pabbisetty, S.V. et al, "Failure Mechanisms in Integrated Circuits", Texas Instruments, Semiconductor Group, Satfford, Texas, pp. 403-419.

* cited by examiner

*Primary Examiner* — Bradley K Smith
(74) *Attorney, Agent, or Firm* — Duane Morris LLP

(57) ABSTRACT

A method of forming an interlayer dielectric film above a metal gate of a metal oxide semiconductor device comprises forming a metal gate above a semiconductor substrate; and forming the interlayer dielectric film above the metal gate by reacting a silicon-containing compound as precursor and a reactant for oxidizing the silicon-containing compound. The silicon-containing compound has the formula:

$$Si_x(A)_y(B)_z(C)_m(D)_n \qquad (I)$$

wherein x is in the range of from 1 to 9; y+z+m+n is in the range of from 4 to 20; and A, B, C, and D independently represent a functional group connecting with a silicon atom. The functional group is selected from a group consisting of alkyl, alkenyl, alkynyl, aryl, alkylaryl, alkoxyl, alkylcarbonyl, carboxyl, alkylcarbonyloxy, amide, amino, alkylcarbonylamino, —NO$_2$, and —CN.

20 Claims, 4 Drawing Sheets

US 8,946,095 B2

METHOD OF FORMING INTERLAYER DIELECTRIC FILM ABOVE METAL GATE OF SEMICONDUCTOR DEVICE

FIELD

The disclosed method relates to semiconductor processing. More particularly, the disclosed subject matter relates to a process for forming interlayer dielectric film above a metal gate of a semiconductor device in a semiconductor processing chamber.

BACKGROUND

Complementary metal oxide semiconductor (CMOS) is a building block for integrated circuits, and CMOS devices are scaled to smaller sizes for advanced performance targets. CMOS technology includes N-type metal oxide semiconductor (NMOS) and P-type metal oxide semiconductor (PMOS). For example, a metal-oxide-semiconductor field-effect transistor (MOSFET) is a transistor used for amplifying or switching electronic signals.

A CMOS transistor generally comprises a semiconductor substrate, a channel layer above the semiconductor substrate, a gate oxide layer and a gate electrode above the channel layer, a source region and a drain region above semiconductor substrate. Contacts are made to the gate electrode, and to both the source and drain regions, of the transistor. With the advent of high-k dielectric materials as the gate oxide in the CMOS process, metal gates or metal layers are used for such contacts in the devices.

After formation of such metal gates or metal layers, a dielectric material is deposited over the metallic surface. For example, silicon dioxide ($SiO_2$) can be formed by depositing a silicon-containing precursor compound such as silane ($SiH_4$) or dicholorosilane ($SiH_2Cl_2$) using a deposition method such as chemical vapor deposition (CVD) in the presence of an oxidizing reactant.

BRIEF DESCRIPTION OF THE DRAWINGS

The present disclosure is best understood from the following detailed description when read in conjunction with the accompanying drawings. It is emphasized that, according to common practice, the various features of the drawings are not necessarily to scale. On the contrary, the dimensions of the various features are arbitrarily expanded or reduced for clarity. Like numerals denote like features throughout specification and drawing.

DETAILED DESCRIPTION

Figure 1:
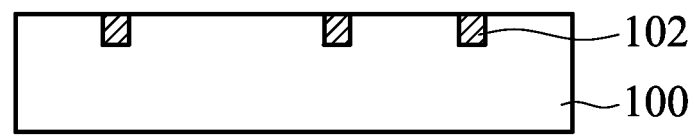
FIG. 1 is a cross section view of a metal gate of a semiconductor device in accordance with some embodiments.

This description of the exemplary embodiments is intended to be read in connection with the accompanying drawings, which are to be considered part of the entire written description. In the description, relative terms such as "lower," "upper," "horizontal," "vertical,", "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

The present disclosure provides a method of forming an interlayer dielectric (ILD) film above a metal gate of a metal oxide semiconductor device, and a method of making a metal oxide semiconductor device comprising forming at least one ILD film above a metal gate. The method of depositing an ILD film over a metal gate comprises utilizing a silicon-containing compound as a precursor having the chemical structures specified in this disclosure. During the deposition process, a reactant is used to oxidize the silicon-containing compound to form the ILD film. The resulting ILD film is substantially free of defects such as extrusion defects and provides good performance to a semiconductor device.

According to this disclosure, the silicon-containing compound precursor can be oxidized with a reactant to form an ILD film comprising silicon oxide or silicates above a metal gate of a metal oxide semiconductor device. The inventors have determined that the chemical structures of the silicon-containing compound, particularly the types of functional groups attached to the at least one silicon atom in the silicon-containing compound, play a determining effect on the quality of the ILD film and ultimately on the performance of a final semiconductor device. For example, in the ILD films that are formed using the currently known process of using a highly reactive precursor such as silane ($SiH_4$) and dichlorosilane ($SiH_2Cl_2$), the inventors have determined that bump defects often form in the ILD films.

Figure 2:
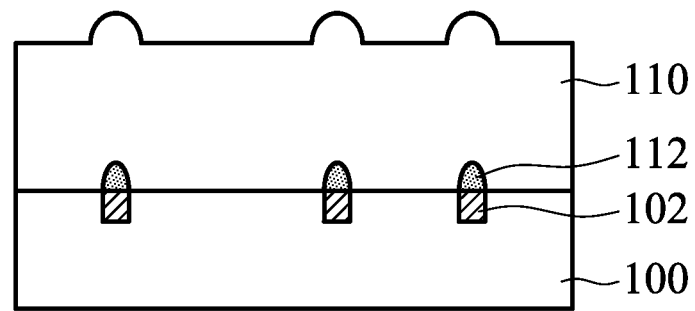
FIG. 2 illustrates a cross section view of one interlayer dielectric film having defects formed above the metal gate of FIG. 1.
Figure 3:
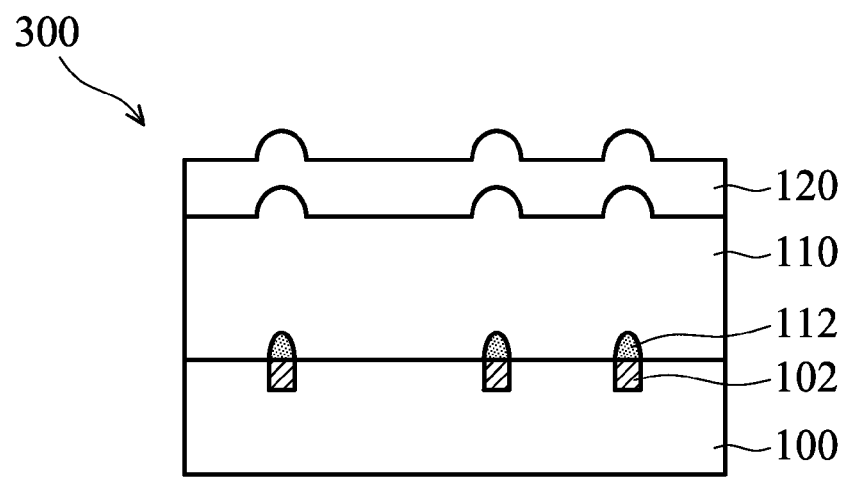
FIG. 3 illustrates a cross section view of a second interlayer dielectric film formed above the structure of FIG. 2.

FIGS. 1-3 illustrate how such bump defects are formed in the currently known process. FIG. 1 is a cross section view of a metal gate 100 of a metal oxide semiconductor device. Other portions of the semiconductor device such as the source region, the drain region, the channel layer and the gate oxide layer are not shown in the drawings. Metal gate 100 may comprise one or more metals. Example of suitable materials for metal gate 100 include but are not limited to W, Ti, Ni, Mo, Co, Ta, Cu, Al and other metals or metal alloys. Metal gate 100 may also comprise two or more types of metals or metal alloys 102 in a certain mixing ratio and a certain configuration pattern. Metal or metal alloy 102 in FIG. 1 is for the purpose of illustration only. Metal or metal alloy 102 can be the same as or different from other parts of metal gate 110 in chemical or physical structure.

Referring to FIG. 2, an ILD film 110 comprising silicon dioxide is formed above metal gate 100 of FIG. 1 using a highly reactive precursor such as silane ($SiH_4$) or dichlorosilane ($SiH_2Cl_2$). Through a process including but not limited to chemical vapor deposition, these precursors react with an oxidant such as $O_2$ and $N_2O$, resulting in formation of ILD film 110. However, the highly reactive precursors also react with the metal gate and form conductive metal silicide that manifests as the metallic bump defects 112. These bump defects 112, also called extrusion defects, can then cause disruption in surface morphology. Referring to FIG. 3, when a second ILD film 120 is formed above the first ILD film 110, bump defects 112 in ILD film 110 can cause uneven surface in the resulting thin film structure 300. More importantly, these bump defects 112 can reduce performance of device and even cause unwanted connection between different layers of the semiconductor device causing electrical shorts.

The inventors also determined that the types of functional groups attached to a silicon atom in these reactive precursors have a determining effect on the formation of bump defects 112. For example, bump defects 112 tend to form when the silicon-containing precursor used contains two or more specific functional groups that connect with a silicon atom. The two or more specific functional groups are selected from the group consisting of a hydrogen atom (—H), a halogen atom (—X), a hydroxyl group (—OH), and a metal atom (M) selected from alkali and alkaline earth metals. In other words, if the total number of the bonds of Si—H, Si—X, Si—OH and Si-M in one molecule of the precursor is higher than two, bump defects tend to occur. For example, a reactive precursor such as $SiH_4$, $SiH_2Cl_2$, $SiNa_2H_2$ likely results in bump defect comprising metal silicide in the ILD film.

According to an embodiment of the present disclosure, the formation of the bump defects can be prevented or substantially eliminated by forming the ILD film above a metal gate of a metal oxide semiconductor device utilizing a silicon-containing compound having the following chemical structure as a precursor material in the ILD film deposition process. The silicon-containing compound has the formula:

$$Si_x(A)_y(B)_z(C)_m(D)_n \qquad (I)$$

wherein:

x is in the range of from 1 to 9;

y+z+m+n is in the range of from 4 to 20; and

A, B, C, and D independently represent a functional group connecting with a silicon atom. In some embodiments, the functional group is selected from a group consisting of alkyl, alkenyl, alkynyl, aryl, alkylaryl, alkoxyl, alkylcarbonyl, carboxyl, alkylcarbonyloxy, amide, amino, alkylcarbonylamino, —$NO_2$, and —CN. In some embodiments, A, B, C, and D independently represent a functional group connecting with a silicon atom, absent two or more groups selected from the group consisting of a hydrogen atom (—H), a halogen atom (—X), a hydroxyl group (—OH), and a metal atom (M) selected from alkali and alkaline earth metals. In some embodiments, A, B, C, and D in the silicon-containing compound independently represent a functional group connecting with a silicon atom, absent one group selected from the group consisting of a hydrogen atom (—H), a halogen atom (—X), a hydroxyl group (—OH), and a metal atom (M) selected from alkali and alkaline earth metals.

Figure 4:
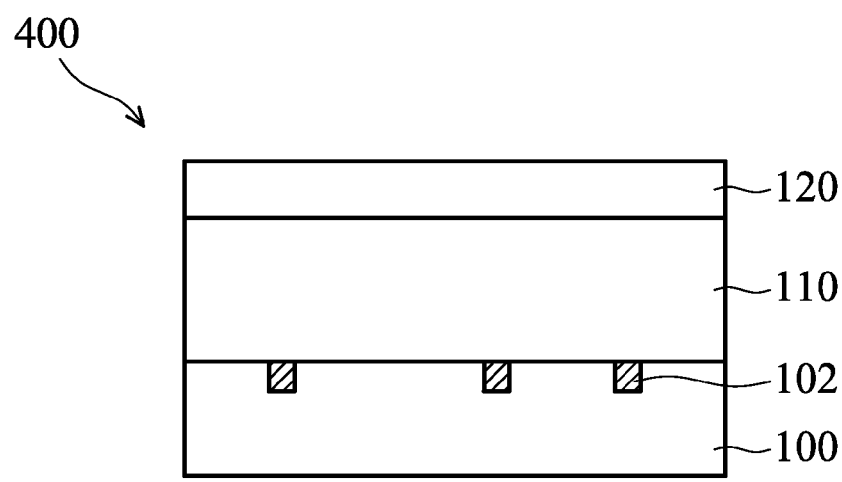
FIG. 4 is a cross section view of a portion of a semiconductor device illustrating two layers of interlayer dielectric films formed above a metal gate in accordance with some embodiments in this disclosure.

The present disclosure also provides a method of making a metal oxide semiconductor device comprising forming at least one such ILD film above a metal gate. The method results in formation of an ILD film 110 or 112 substantially free of bump defects 112 as shown in FIG. 4. FIG. 4 is a section view of a portion of a metal oxide semiconductor device 400 illustrating two layers of interlayer dielectric films 110 and 112 formed above a metal gate in accordance with some embodiments in this disclosure. For brevity, description of the structures in FIG. 4 that were already described above with reference to FIGS. 1-3, are not repeated. Suitable materials for an ILD film 110 or 112 include but are not limited to silicon oxide of any ratio of Si:O, silicate, boronsilicate, phosphosilicate and borophosphosilicate.

In some embodiments, a method of forming an ILD film above a metal gate of a metal oxide semiconductor device comprises providing a silicon-containing compound as precursor into an ILD film deposition chamber, and providing a reactant to oxidize the silicon-containing compound into the ILD film deposition chamber. The ILD film deposition chamber can be a CVD chamber in some embodiments. Examples of a suitable process include but are not limited to a CVD process under plasma conditions. Other suitable processes include but are not limited to atomic layer deposition (ALD) and thermal vapor deposition.

In some embodiments, the method of forming an ILD film above a metal gate of a metal oxide semiconductor device further comprises providing at least one of a boron-containing compound and a phosphorous-containing compound. In some embodiments, both a boron-containing compound and a phosphorous-containing compound are provided. Unless expressly indicated otherwise, the term "above" made in this disclosure will be understood to encompass that a layer is formed above or on a layer. For example, an ILD film above a metal gate may include that the ILD film is situated on the metal gate or upwardly extended from the metal gate. References to "a silicon-containing compound" made in this disclosure will be understood to encompass a compound having one or multiple silicon atoms connected with each other in a linear or a cyclic ring structure. The silicon atoms are connected with each directly or through linkage of oxygen —O—. References to "a boron-containing compound" in this disclosure will be understood to encompass a compound comprising at least one boron atom. Reference to "a phosphorous-containing compound" will be understood to encompass a compound comprising at least one phosphorous atom. As used herein, the term "connecting," for example, in the description of "a functional group connecting with a silicon atom," refers to attachment of a functional group with a specified atom through chemical bonding.

As used herein, the term "alkyl" refers to an optionally substituted, saturated, straight or branched hydrocarbon having at least one carbon atoms, such as about 1 to about 20 carbon atoms, from about 1 to about 4 carbon atoms in some embodiments. In some embodiments, the alkyl is optionally substituted. For example, one or more of the hydrogen atoms (e.g., 1-6) on the alkyl group, are substituted with a F, Cl, Br, $NH_2$, $NO_2$, $N_3$, CN, COOH, OH, etc. Alkyl groups include, but are not limited to, methyl, ethyl, n-propyl, isopropyl, n-butyl, isobutyl, sec-butyl, t-butyl, n-pentyl, isopentyl, neopentyl, n-hexyl, isohexyl, 3-methylpentyl, 2,2-dimethylbutyl, and 2,3-dimethylbutyl. In some embodiments, an alkyl group may be a cycloalkyl group.

As used herein, the term "alkenyl" as a group or a part of a group refers to an optionally substituted straight or branched hydrocarbon chain containing carbon atoms (e.g., 2 to 6 carbon atoms) and containing at least one double bond. Examples of "alkenyl" as used herein include, but are not limited to, ethenyl, 2-propenyl, 3-butenyl, 2-butenyl, 2-pentenyl, 3-pentenyl, 3-methyl-2-butenyl, 3-methylbut-2-enyl, 3-hexenyl and 1,1-dimethylbut-2-enyl.

The term "alkynyl" as used herein as a group refers to an optionally substituted straight or branched hydrocarbon chain containing carbon atoms (e.g., 2 to 6 carbon atoms) and containing at least one triple bond. Examples of "alkynyl" as used herein include, but are not limited to, ethynyl, 2-propynyl, 3-butynyl, 2-butynyl, 2-pentynyl, 3-pentynyl, 3-methyl-2-butynyl, 3-methylbut-2-ynyl, 3-hexynyl and 1,1-dimethylbut-2-ynyl.

As used herein, the term "aryl" refers to an optionally substituted, mono-, di-, tri-, or other multicyclic aromatic ring system having at least 6 carbon atoms, for example, from about 6 to about 14 carbon atoms. Non-limiting examples include, for example, phenyl, naphthyl, anthracenyl, and phenanthrenyl. Aryl may optionally be further fused to an aliphatic or aryl group or can be substituted with one or more substituents such as halogen (fluorine, chlorine and/or bromine), hydroxy, alkyl, alkoxy or aryloxy, amido, nitro, alkylenedioxy, alkylthio or arylthio, alkylsulfonyl, cyano, or primary, secondary or tertiary amino.

As used herein, the term "alkoxy" refers to an optionally substituted straight or branched chain alkyl —O-group wherein alkyl is as previously defined. Examples of "alkoxy" as used herein include, but are not limited to, methoxy, ethoxy, propoxy, prop-2-oxy, butoxy, but-2-oxy, 2-methylprop-1-oxy, 2-methylprop-2-oxy, pentoxy and hexyloxy. A $C_{1-4}$ alkoxy group is preferred, for example methoxy, ethoxy, propoxy, prop-2-oxy, butoxy, but-2-oxy or 2-methylprop-2-oxy. In some embodiments, the alkyl moieties of the alkoxy groups have from about 1 to about 4 carbon atoms. The term "aryloxy" refers to an optionally substituted aryl-O-group wherein aryl is as previously defined. Exemplary aryloxy groups include, but are not limited to, phenoxy (phenyl-O—) and naphthoxy (naphthyl-O).

The term "alkylcarbonyl" as used herein as a group refers to a functional group having the formula —C(O)-alkyl, in which alkyl is defined above. The group of —C(O) represents a carbonyl group (—C=O) in this disclosure. Examples of such a group include but are not limited to —C(O)—CH$_3$ and —C(O)—CH$_2$CH$_3$.

The term "alkylcarbonyloxy" as used herein as a group refers to a functional group having the formula —O—C(O)-alkyl, in which alkyl is defined above. Examples of such a group include but are not limited to acetoxyl group (CH$_3$—C(O)—O—).

As used herein, the term "carboxyl" refers to a chemical group having the formula —C(O)—O-alkyl or —COOH, in which alkyl is defined above. Examples of such a group include but are not limited to —COOH, —C(O)—O—CH$_3$ and —C(O)O—CH$_2$CH$_3$.

As used herein, the term "amino" refers to the group —NR$_1$R$_2$, where R$_1$ and R$_2$ may independently represent hydrogen or an alkyl group as defined above. Examples of an amino group includes but are not limited to —NH$_2$, —N(CH$_3$)$_2$, and —NHCH$_3$.

As used herein, the term "amide" or "amidyl" refers to a group having the formula —C(O) NR$_1$R$_2$, in which the amino group NR$_1$R$_2$ is defined as above. Examples of such a group include but are not limited to —C(O)—NHCH$_3$.

The term "alkylcarbonylamino" as used herein as a group refers to a functional group having the formula —NH—C(O)-alkyl, in which alkyl is defined as above. Examples of such a group include but are not limited to —NH—C(O)—CH$_3$.

The term "halogen" as used herein as an atom refers to fluorine, chloride, bromine, and iodine. The term "halogen" as used herein as a group refers to fluoro, chloro, bromo, and iodo.

Figure 5:
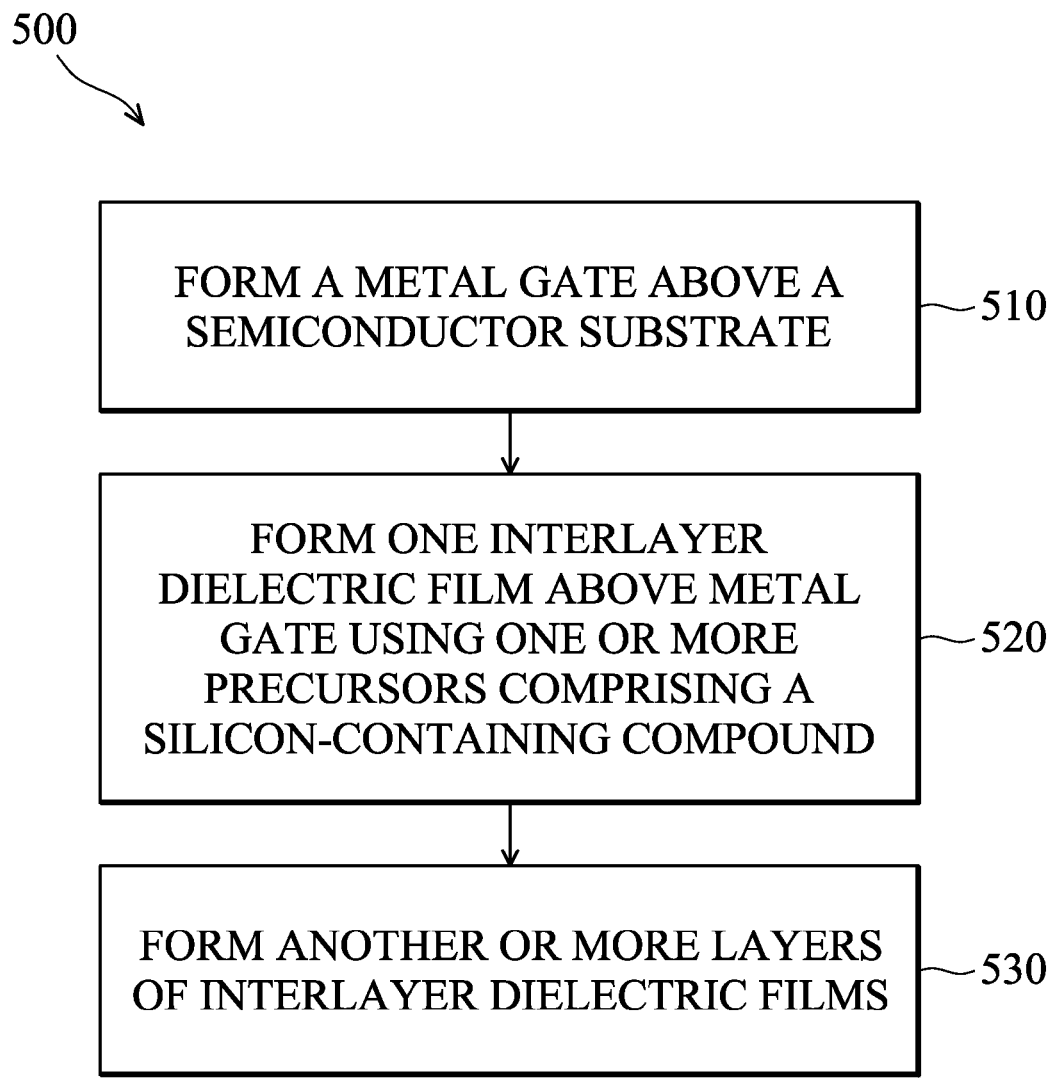
FIG. 5 is a flow chart diagram illustrating a method of making a semiconductor device comprising forming at least one interlayer dielectric film above a metal gate according to this disclosure.

Referring to FIG. 5, a flow chart 500 shows an example of a method for making a semiconductor device comprises forming at least one ILD film such as ILD layer 110, above a metal gate 100 according to this disclosure. In step 510, a metal gate 100 is formed above a semiconductor substrate, which can be any semiconductor materials including but not limited to silicon and III-V semiconductor compound. An exemplary structure is illustrated and described in FIG. 1.

Before or during this step, other portions of the semiconductor device such as a channel layer, a source region, a drain region, and a gate oxide layer (not shown in FIG. 1) can be formed. For example, a gate oxide layer of a high-k dielectric can be deposited before forming metal gate 100.

Metal gate 100 comprises one or more metal or metal alloys, which include but are not limited to W, Ti, Ni, Mo, Co, Ta, Cu and Al. The metal or metal alloys can be deposited using methods such as Plasma Enhanced Chemical Vapor Deposition (PECVD), sputtering and Chemical Vapor Deposition (CVD). In some embodiments, metal gate 100 can further comprise a barrier layer of a material selected from the group comprising titanium nitride, tantalum, tungsten, niobium, molybdenum, Ti/TiN, Ti/W, or TiN. Copper interconnects may also be encapsulated by at least one diffusion barrier such as silicon nitride to prevent diffusion.

Figure 6:
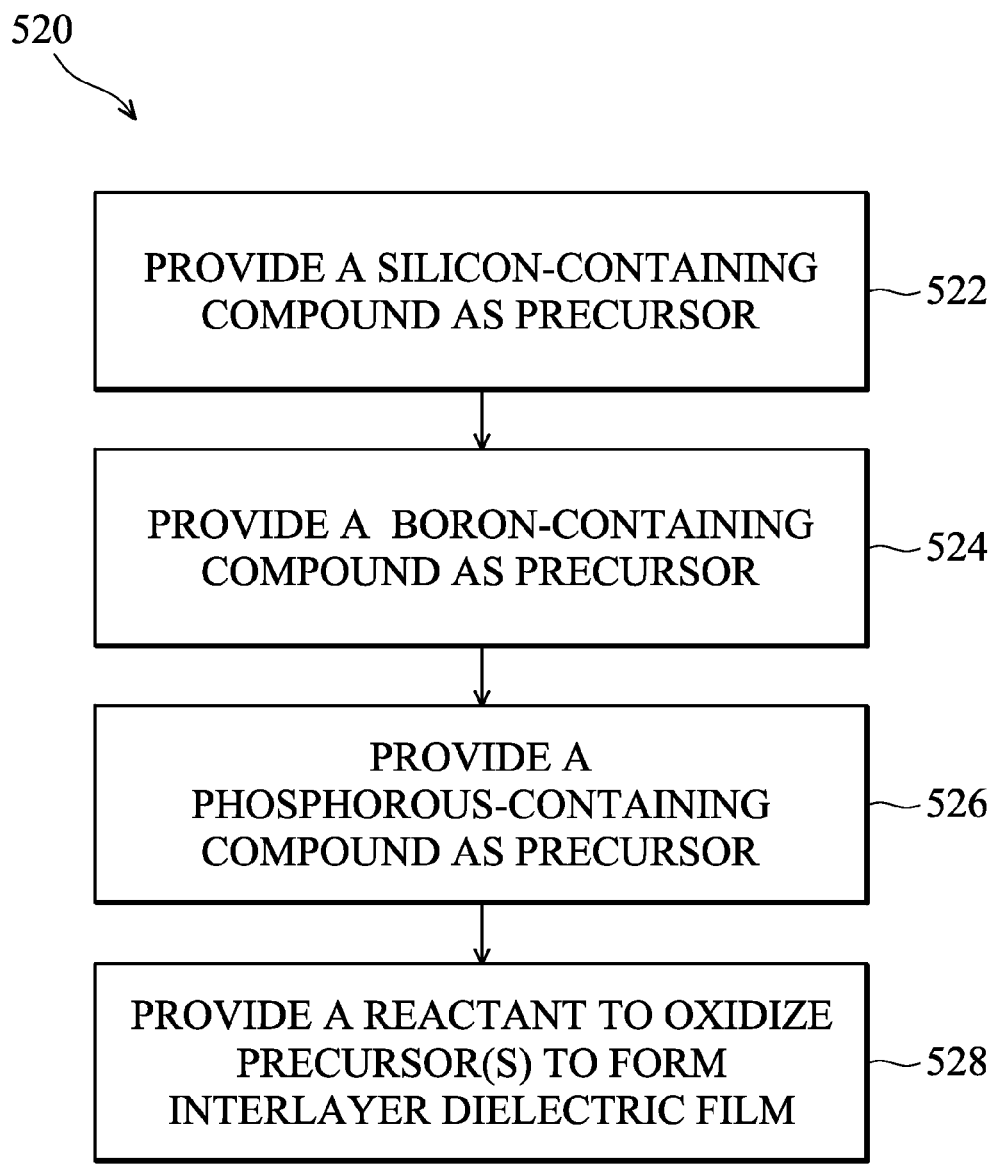
FIG. 6 is a flow chart diagram illustrating a method of forming an interlayer dielectric film above a metal gate of a semiconductor device in some embodiments.

In step 520, at least one ILD film is deposited above metal gate 100 using one or more precursors in an interlayer dielectric film deposition chamber. The one or more precursors comprise a silicon-containing compound. An example of step 520 is illustrated in FIG. 6. FIG. 6 is a flow chart diagram illustrating the step 520 of forming an ILD film above a metal gate 100 of a semiconductor device in some embodiments.

Step 522 of FIG. 6 comprises providing in an interlayer dielectric film deposition chamber the silicon-containing compound as the new precursor material disclosed herein. In some embodiments, the silicon-containing compound is a silane ester selected from the group consisting of monoorganoalkoxysilanes, tetraorganoxylsilanes and acyloxysilane. Representative monoorganoalkoxysilanes include but are not limited to CH$_3$Si(OCH$_3$)$_3$ (methyltrimethoxysilane), CH$_3$Si(OC$_2$H$_5$)$_3$ (methyltriethoxysilane), C$_2$H$_5$Si(OCH$_3$)$_3$(ethyltrimethoxylsilane), C$_2$H$_5$Si(OC$_2$H$_5$)$_3$ (ethyltriethoxysilane). Representative tetraorganoxylsilanes include but are not limited to Si(OCH$_3$)$_4$ (tetramethoxysilane) and Si(OC$_2$H$_5$)$_4$ (tetraethoxysilane or tetraethyl orthosilicate). Representative acyloxysilanes include but are not limited to Si(OCOCH$_3$)$_4$ (tretracetoxysilane) and CH$_3$Si(OCOCH$_3$)$_3$ (methyltricetoxysilane).

The one or more precursors comprising a silicon-containing compound can be ionized under plasma conditions in some embodiments. Heating conditions may also be applied to the one or more precursors during the process.

In step 528 of FIG. 6, a reactant is provided into the processing chamber to oxidize the one or more precursors comprising a silicon-containing compound. For example, the reactant may comprise a chemical selected from a group consisting of O$_2$, O$_3$ and NH$_3$. The reactant reacts with the silicon-containing compound to form the interlayer dielectric film comprising silicon oxide of any ratio of Si:O or silicate. The reaction can undergo in a process of chemical vapor deposition (CVD) under plasma conditions.

In step 524 and 526, a boron-containing or phosphorous compound as additional precursors can be optionally introduced to react with the reactant to form a composition selected from a group consisting of boronsilicate, phosphosilicate and boronphosphosilicate in the interlayer dielectric film. These additional precursors can be ionized in a CVD process under plasma or thermal conditions in some embodiments. In some embodiments, only a boron-containing compound is provided, as shown in step 524, into the intelayer dielectric film deposition chamber having the silicon-containing compound as precursor to form boronsilicate. For example, nonexclusive examples of a boron-containing compound can be selected from the group consisting of diborane, trimethyl borate, triethyl borate and tripropyl borate. In some other embodiments, only a phosphorous-containing compound is provided, as shown in step 526, to form phosphosilicate. For example, a phosphorous-containing compound is selected from the group consisting of phosphane, trimethyl phosphate, triethyl phosphate, and trimethyl phosphite in some embodiments. In some other embodiments, as shown in FIG. 6 comprising steps 522, 524, 526 and 528, both a boron-containing compound and a phosphorous-containing compound are introduced into the processing chamber to form boronphosphosilicate.

The steps shown in FIG. 6 are not necessarily performed in the order shown. The steps may be performed in a different sequence or simultaneously. The process of these steps are not limited to a CVD process under plasma conditions. Other suitable processes include but are not limited to atomic layer deposition (ALD) and thermal vapor deposition.

Referring back to step 530 of FIG. 5, another or more layers of ILD films can be optionally formed using the same method as described in step 520, resulting in a structure illustrated in FIG. 4.

The present disclosure provides a method of forming an ILD film above a metal gate of a metal oxide semiconductor device, and a method of making a metal oxide semiconductor device comprising forming at least one interlayer dielectric film above a metal gate.

In some embodiments, a method of forming an interlayer dielectric film above a metal gate of a metal oxide semiconductor device comprises providing a silicon-containing compound as precursor, and providing a reactant to oxidize the silicon-containing compound. The silicon-containing compound is disclosed herein. In some embodiments, the reactant comprises a chemical selected from a group consisting of $O_2$, $O_3$ and $NH_3$. The reactant reacts with the silicon-containing compound to form the interlayer dielectric film. In some embodiments, the method of forming an interlayer dielectric film above a metal gate of a metal oxide semiconductor device further comprises providing at least one of, or both of, a boron-containing compound and a phosphorous-containing compound.

A method of making a metal oxide semiconductor device comprises forming a metal gate above a semiconductor substrate; and forming at least one interlayer dielectric film above the metal gate using one or more precursors comprising a silicon-containing compound. The method for forming at least one interlayer dielectric film has been described above.

Although the subject matter has been described in terms of exemplary embodiments, it is not limited thereto. Rather, the appended claims should be construed broadly, to include other variants and embodiments, which may be made by those skilled in the art.

What is claimed is:

1. A method of forming an interlayer dielectric film above a metal gate of a metal oxide semiconductor device, comprising:
    forming a metal gate above a semiconductor substrate; and
    forming the interlayer dielectric film above and contacting the metal gate by reacting a silicon-containing compound in vapor form as precursor and a reactant for oxidizing the silicon-containing compound,
    wherein the silicon-containing compound has a formula:

$$Si_x(A)_y(B)_z(C)_m(D)_n \qquad (I)$$

wherein:
    x is in the range of from 1 to 9;
    y+z+m+n is in the range of from 4 to 20; and
    A, B, C, and D independently represent a functional group connecting with a silicon atom, and the functional group is selected from a group consisting of alkyl, alkenyl, alkynyl, aryl, alkylaryl, alkoxyl, alkylcarbonyl, carboxyl, alkylcarbonyloxy, amide, amino, alkylcarbonylamino, —$NO_2$, and —CN,
    when one of A, B, C and D is alkoxyl, at least two of A, B, C and D are different from each other.

2. The method of claim 1, wherein the reactant comprises a chemical selected from a group consisting of $O_2$, $O_3$ and $NH_3$.

3. The method of claim 1, wherein
    the silicon-containing compound is a silane ester selected from the group consisting of monoorganoalkoxysilanes, tetraorganoxylsilanes and acyloxysilane.

4. The method of claim 1, further comprising:
    providing at least one of a boron-containing compound and a phosphorous-containing compound to form a composition selected from a group consisting of boronsilicate, phosphosilicate and boronphosphosilicate.

5. The method of claim 4, wherein
    a boron-containing compound is selected from the group consisting of diborane, trimethyl borate, triethyl borate and tripropyl borate; and
    a phosphorous-containing compound is selected from the group consisting of phosphane, trimethyl phosphate, triethyl phosphate, and trimethyl phosphite.

6. The method of claim 1, wherein the method is performed in a process of chemical vapor deposition (CVD) under plasma conditions.

7. A method of forming an interlayer dielectric film above a metal gate in a metal oxide semiconductor device, comprising:
    providing a silicon-containing compound having the formula:

$$Si_x(A)_y(B)_z(C)_m(D)_n \qquad (I)$$

wherein:
    x is in the range of from 1 to 9;
    y+z+m+n is in the range of from 4 to 20; and
    A, B, C, and D independently represent a functional group connecting with a silicon atom, the functional group is selected from a group consisting of alkyl, alkenyl, alkenyl, aryl, alkylaryl, alkoxyl, alkylcarbonyl, carboxyl, alkylcarbonyloxy, amide, amino, alkylcarbonylamino, —$NO_2$, —CN, a hydrogen atom (—H), a halogen atom (—X) (selected from the group consisting of fluorine, chloride, bromine, and iodine), a hydroxyl group (—OH), and a metal atom (M) (selected from the group consisting of Li, Na, K, Be, Mg and Ca),
    when one of A, B, C and D is alkoxyl, at least two of A, B, C and D are different from each other,
    absent two or more groups selected from the group consisting of a hydrogen atom (—H), a halogen atom (—X), a hydroxyl group (—OH), and a metal atom (M); and
    providing a reactant to oxidize the silicon-containing compound.

8. The method of claim 7, wherein A, B, C, and D in the silicon-containing compound independently represent a functional group connecting with a silicon atom, absent one group selected from the group consisting of a hydrogen atom (—H), a halogen atom (—X), a hydroxyl group (—OH), and a metal atom (M).

9. The method of claim 7, wherein the reactant comprises a chemical selected from a group consisting of $O_2$, $O_3$ and $NH_3$.

10. The method of claim 7, further comprising:
    providing at least one of a boron-containing compound and a phosphorous-containing compound to form a composition selected from a group consisting of boronsilicate, phosphosilicate and boronphosphosilicate.

11. The method of claim 7, wherein the silicon-containing compound is selected from a group consisting of $CH_3Si(OCH_3)_3$ (methyltrimethoxysilane), $CH_3Si(OC_2H_5)_3$ (methyltriethoxysilane), $C_2H_5Si(OCH_3)_3$ (ethyltrimethoxylsilane), $C_2H_5Si(OC_2H_5)_3$ (ethyltriethoxysilane), $Si(OCOCH_3)_4$ (tretracetoxysilane) and $CH_3Si(OCOCH_3)_3$ (methyltricetoxysilane).

12. A method of making a metal oxide semiconductor device, comprising:
  forming a metal gate above a semiconductor substrate; and
  forming at least one interlayer dielectric film above and contacting the metal gate using one or more precursors in vapor form, the one or more precursors comprising a silicon-containing compound having the formula:

$$Si_x(A)_y(B)_z(C)_m(D)_n \qquad (I)$$

wherein:
x is in the range of from 1 to 9;
y+z+m+n is in the range of from 4 to 20; and
A, B, C, and D independently represent a functional group connecting with a silicon atom, the functional group is selected from a group consisting of alkyl, alkenyl, alkynyl, aryl, alkylaryl, alkoxyl, alkylcarbonyl, carboxyl, alkylcarbonyloxy, amide, amino, alkylcarbonylamino, —$NO_2$, —CN, a hydrogen atom (—H), a halogen atom (—X) (selected from the group consisting of fluorine, chloride, bromine, and iodine), a hydroxyl group (—OH), and a metal atom (M) (selected from the group consisting of Li, Na, K, Be, Mg and Ca),
when one of A, B, C and D is alkoxyl, at least two of A, B, C and D are different from each other,
absent two or more groups selected from the group consisting of a hydrogen atom (—H), a halogen atom (—X), a hydroxyl group (—OH), and a metal atom (M).

13. The method of claim 12, wherein A, B, C, and D in the silicon-containing compound independently represent a functional group connecting with a silicon atom, absent one group selected from the group consisting of a hydrogen atom (—H), a halogen atom (—X), a hydroxyl group (—OH), and a metal atom (M).

14. The method of claim 12, wherein the metal gate comprises two different types of metal.

15. The method of claim 12, wherein the at least one interlayer dielectric film comprises two or more layers of films, each of the two or more layers comprising silicon dioxide or silicate.

16. The method of claim 12, wherein the forming at least one interlayer dielectric film comprises:
  providing the silicon-containing compound in an interlayer dielectric film deposition chamber; and
  providing a reactant for oxidizing the silicon-containing compound in the interlayer dielectric film deposition chamber.

17. The method of claim 16, wherein the reactant comprises a chemical selected from a group consisting of $O_2$, $O_3$ and $NH_3$.

18. The method of claim 16, wherein the forming at least one interlayer dielectric film further comprises:
  providing at least one of a boron-containing compound and a phosphorous-containing compound in the interlayer dielectric deposition chamber to form a composition selected from a group consisting of boronsilicate, phosphosilicate and boronphosphosilicate.

19. The method of claim 16, wherein the forming at least one interlayer dielectric film further comprises:
  providing a boron-containing compound and a phosphorous-containing compound in the intelayer dielectric film deposition chamber to form boronphosphosilicate.

20. The method of claim 16, wherein the forming at least one interlayer dielectric film is performed in a process of chemical vapor deposition (CVD) under plasma conditions.

* * * * *